United States Patent [19]
Steinich et al.

[11] Patent Number: 5,473,237
[45] Date of Patent: Dec. 5, 1995

[54] ANGLE-POSITION SENSOR FOR THE ABSOLUTE MEASUREMENT OF THE ANGLE OF ROTATION OVER A PLURALITY OF REVOLUTIONS

[75] Inventors: Klaus-Manfred Steinich, Unterhaching; Peter Wirth, Munich, both of Germany

[73] Assignee: ASM Automation, Sensorik, Messtechnik GmbH, Unterhaching, Germany

[21] Appl. No.: 122,589

[22] PCT Filed: Feb. 4, 1993

§ 102(e) Date: PCT/EP93/00257

§ 371 Date: Oct. 5, 1993

§ 102(e) Date: Oct. 5, 1993

[87] PCT Pub. No.: WO93/16354

PCT Pub. Date: Aug. 19, 1993

[30] Foreign Application Priority Data

Feb. 5, 1992 [DE] Germany .......................... 42 03 236.9

[51] Int. Cl.[6] .................................................. H02P 7/00
[52] U.S. Cl. ............................. 318/605; 73/1 E; 318/254
[58] Field of Search .................................. 318/605, 432, 318/138, 439, 254; 324/160, 163, 164, 167, 173, 174, 179, 117 H, 126, 168 MG; 73/2, 1 E

[56] References Cited

U.S. PATENT DOCUMENTS

| 3,446,982 | 5/1969 | Dowling et al. |
|---|---|---|
| 3,806,785 | 4/1974 | Devalroger et al. ..................... 318/254 |
| 3,835,375 | 9/1974 | Rovner .................................. 324/43 R |
| 3,875,372 | 10/1974 | Ringland et al. ................... 318/423 X |
| 3,950,993 | 4/1976 | Sidor ..................................... 73/362 R |
| 4,027,213 | 5/1977 | Devlaroger ............................. 318/138 |
| 4,100,472 | 7/1978 | Mobley .................................... 318/685 |
| 4,363,999 | 12/1982 | Preikschat ................................ 318/53 |
| 5,161,311 | 11/1992 | Esmer et al. ....................... 324/245 X |

FOREIGN PATENT DOCUMENTS

| 2907672C2 | 9/1979 | Germany . |
| 2938318C2 | 3/1981 | Germany . |
| 3246959C2 | 7/1983 | Germany . |
| 3711062C2 | 10/1988 | Germany . |
| 3734938 | 5/1989 | Germany . |

Primary Examiner—Jonathan Wysocki
Attorney, Agent, or Firm—Lowe, Price, Leblanc & Becker

[57] ABSTRACT

A robust angle-position sensor for the absolute measurement of the angle of rotating or angle position, respectively over several revolutions has a resolver and further inductive angle of rotation sensor elements. Switching elements of a time multiplex device are in the form of toroidal core chokes. The electronic processing circuit is arranged at a point remote from the point of measurement.

5 Claims, 3 Drawing Sheets

ANGLE-POSITION SENSOR FOR THE ABSOLUTE MEASUREMENT OF THE ANGLE OF ROTATION OVER A PLURALITY OF REVOLUTIONS

FIELD OF THE INVENTION

The invention relates to an angle-position sensor, i.e. a sensor or detector for an angle-position.

BACKGROUND OF THE INVENTION

Known sensors are employed in order to measure the angular positions of rotating parts, for instance in the form of an engine shaft, absolutely over several revolutions. Their technical function is to be seen in that unlike sensors operating incrementally and with a counting action, they provide an output with the correct angle of rotation or angle position, respectively in every operational state, for instance after switching on or after interruption of operation.

An angle of rotation sensor of this type is described in the company publication IMAS (inductive modular absolute measuring system) of EUCRON, of Leinfelden-Echterdingen, Germany, which consists of coarse and fine angle-position sensor elements, which are coupled together in sequence by means of transmissions. Using a multiplexer, which is connected on the one hand with the sensor elements and on the other hand with processing electronic circuitry, the angular information of the individual sensor elements is sequentially processed. Driving the multiplexer and the furthermore the selection of an individual sensor element is performed by different DC levels, which is employed to modulate the sensor element excitation voltage, which is supplied to the multiplexer by the processing circuit. The multiplexer is made up of semiconductor components such as semiconductor switches for switching the sensor signals and comparators for detecting the DC control level. The auxiliary energy for driving the multiplexer is derived from the sensor element excitation voltage with the aid of rectifiers. The disadvantage of this angle of rotation sensor resides in the integration of semiconductor components at the point of measurement. Such components render the sensor sensitive to environmental effects such as interfering electrical and magnetic fields and furthermore extreme variations in temperature as are likely in drive technology.

A further angle-position sensor is described in German patent publication 3,734,938 A1. The arrangement provides a plurality of resolvers coupled by means of transmissions with one another. The transmission ratios are set at 2EXP(N). The code is a single step one or cyclic code, respectively. The linking of the angular information of the individual sensor elements is made by means of a redundant bit. The disadvantage of this arrangement is the limitation, due to the processing circuitry, to certain speed ratios. This is something which impairs optimization as regards design in the form of small units, which are an advantage. A further disadvantage is to be seen in the limitation to a single step code. Such code must be converted for processing in standard industrial control units by means of a code converter into the natural dual code. A further disadvantageous feature is the restriction, due to the processing circuit, to one single bit digit for linking the angular information of individual sensor elements. This limits tolerances for the transmission backlash of the transmissions to ¼ revolution of the respectively preceding shaft. The mechanical complexity for the design of the transmissions is consequently higher than is necessary. A further disadvantage is the level of costs due to the exclusive use of resolvers.

A further sensor is disclosed in the German patent publication 3,246,959 C. In this case a plurality of sensor elements are coupled together in tandem using differential step down transmissions with small step down ratios. The disadvantage of the use of differential drives on the high speed input shafts is the high rotor speed of the following sensor elements coupled in sequence. This places high loads on the bearings thereof and leads to an expensive mechanical design.

Both the German patent publication 3,246,959 and also the German patent publication 3,734,938 disclose the sequential processing of the signals from the sensor elements with the aid of the multiplex method. However, there is no provision of a trouble-free multiplexer at little expense.

The German patent publication 2,907,672 discloses the employment of toroidal core chokes for the sequential processing the information bit of one or more angular encoders. Here it is a disadvantage that there is an extremely complex digital design of the angular encoders using magnetically encoding single elements and the low angular resolution, which can be attained.

Optical absolute angular sensors and furthermore capacitive angle of rotation sensors are disclosed in the German patent publications 2,938,318 C and 3,711,062 C. They utilize glass disks with optically encoded divisions or, respectively, stationary and rotating capacitor plates for encoding angular information. The disadvantage of the optical and capacitive sensors is their sensitivity to interfering electrical and magnetic fields and furthermore extreme temperature fluctuations owing to the integrated signal processing electronic system. A further disadvantage of the optical sensors is the sensitivity of the glass disks as regards vibrations and soiling.

SUMMARY OF THE INVENTION

One object of the present invention is to provide an angle-position sensor for the measurement of angles of rotation over several revolutions which while having a satisfactory resolution is substantially unaffected by electrical, magnetic, electromagnetic, thermal and radioactive interfering effects and furthermore as regards mechanical vibrations.

The present invention is concerned with an angle-position sensor for the absolute measurement of the angle of rotation over a plurality of revolutions, comprising a resolver connected with the rotary shaft to be monitored as a fine angle-position sensor element and a plurality of inductive, coarse angle-position sensor elements respectively coupled up by way of a step down transmission, an analog/digital converter for modulation and conversion of the analog AC output signals of the inductive sensor elements into a binary data word, a time multiplexer, which sequentially supplies the analog signals of the individual sensor elements to the analog/digital converter, an electronic processing circuit, which intermediately stores the angle-position information present as binary words, of the individual sensor elements and combines the same as absolute angular information over several revolutions, wherein as switching elements of the time multiplexer device toroidal core chokes are provided and in that the toroidal core chokes possess a switching winding and a switched winding.

In accordance with the invention as switching elements of the time division multiplex device toroidal core chokes are employed. The use of inductive switching elements in multiplex technology advantageously provides for a saving as regards wiring without rendering the sensor less sturdy or sensitive.

The toroidal core chokes possess a switching winding and a switched winding. The magnetic material of the toroidal core chokes has a magnetization curve with sections of approximately constant, high differential permeability and approximately constant low permeability. Owing to the formation of sufficiently high inductive resistances in the switched off or, respectively, blocking condition and owing to the formation of sufficiently low inductive resistances in the switched or turned on state this renders possible use of the chokes as switch elements for AC.

The magnetic material of the toroidal core chokes has a low coercive field force. This makes it possible to keep low distortion of the AC to be switched in the "switched on" condition of the chokes.

The electronic processing circuit connected via the leads with the sensors may be arranged at some point remote from the point of measurement. This in turn renders possible the advantage of accommodating the processing circuit, which is otherwise sensitive to environmental effects, in a control box.

The angle-position sensor, in other words the sensor for the angle of rotation according to the present invention advantageously exclusively consists of inductive components and as regards its electromagnetic, thermal and mechanical compatibility with the environment is particularly sturdy and resistant.

The linking of the digital angular information from the resolver and sensor elements connected with the output thereof is performed by an electronic processing circuit. Since the analog/digital conversion of the angular information from the coarse sensor elements is implemented with the same resolution as is the case with the fine sensor elements, there is more than only one redundant information bit available for the linking calculation. This renders it possible to allow a greater tolerance as regards transmission backlash (±½ revolution of the transmission input shaft in comparison with ±¼ revolution in the case of the use of only one single redundant information bit) or to select higher step down ratios for a certain tolerance as regards transmission backlash. Moreover owing to the enhanced resolution of the angular information of the coarse sensor elements error recognition becomes possible, which makes possible detection of the degree or wear of the transmission. A limitation of the transmission to certain or mutually equivalent transmission ratios is not present owing to the programmable processing circuit. This in turn makes it advantageously possible to minimize the mechanical overall size of the transmission. The processing of the signals from all angle-position sensor elements takes place in a fashion dependent on the operational state, for example on switching on the power supply. During normal operation only the signals from the fine angle-position sensor elements are processed and the number of entire revolutions is determined incrementally by counting the amounts carried.

Further advantageous developments and convenient forms of the invention will be understood from the following detailed descriptive disclosure of one preferred embodiment thereof in conjunction with the accompanying drawings.

DETAILED DESCRIPTION OF THE INVENTION

Figure 1:
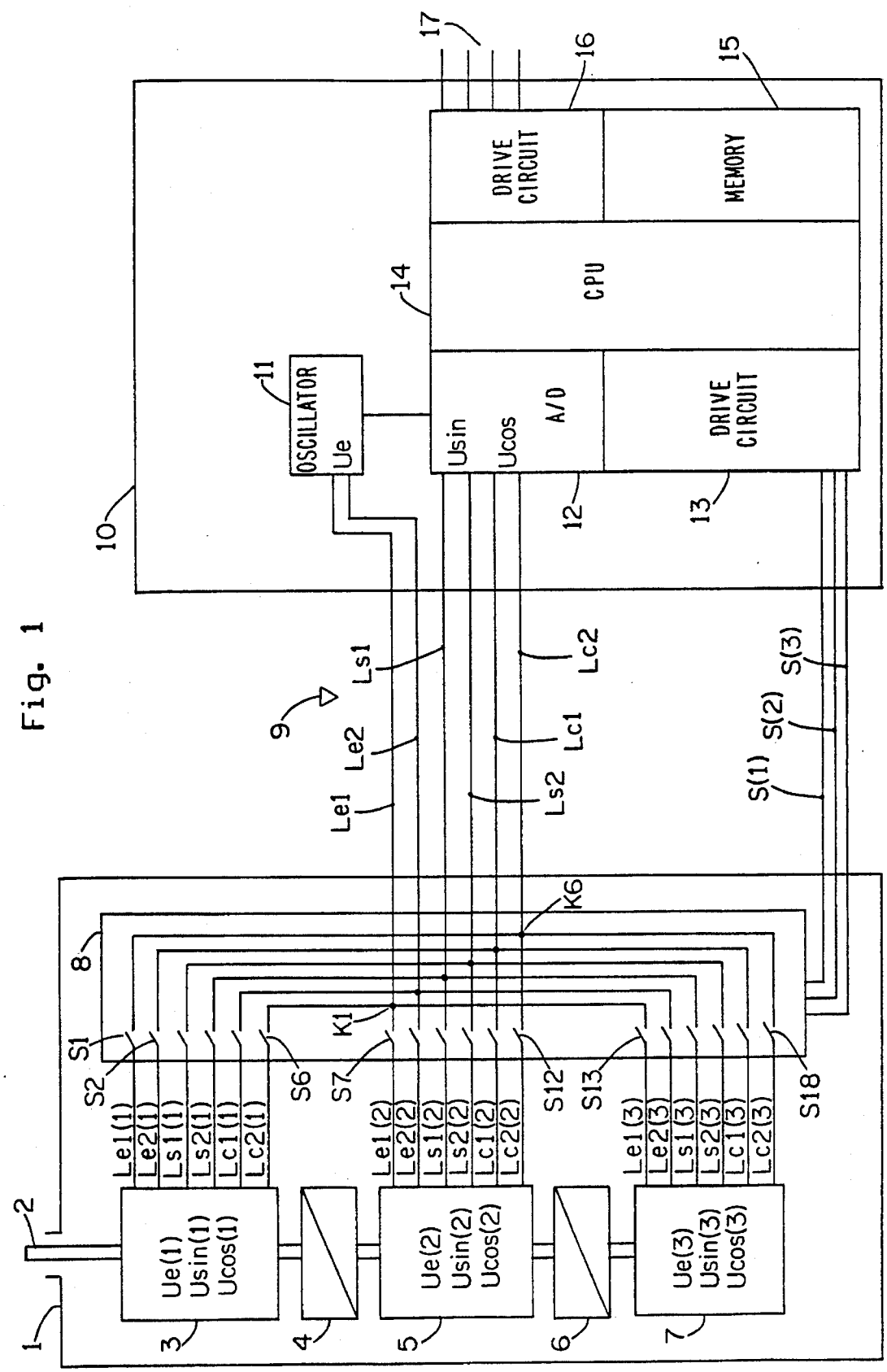
FIG. 1 is a diagrammatic view of an angle-position sensor with its processing circuit.

FIG. 1 shows an angle-position sensor 1 and an electronic processing circuit 10 associated with it. A resolver 3 serves as a first fine angle-position sensor element of the angle-position sensor for detecting an angle of rotation and is directly coupled with a power shaft 2, whose mechanical angle of rotation position is to be measured.

Via step down transmissions 4 and 6 a plurality of coarse angle-position sensor elements 5 and 7 are coupled with the shaft in sequence. Each of the sensor elements 3, 5 and 7 receives exciting AC Ue(i) via two input lines Le1(i) and Le2(i). Each of the sensor elements 3, 5 and 7 supplies an output voltage Usin(i) via two output lines Ls1(i) and Ls2(i) and via two further output lines Lc1(i) and Lc2(2) it supplies an output voltage Ucos(i). The input and output lines of the sensor elements 3, 5 and 7 are connected with a multiplexer 8 which is preferably installed in the angle of rotation sensor. The multiplexer 8 is connected via a cable 9 with the electronic processing circuit 10, said cable preferably having six cores Le1, Le2, Ls1, Ls2, Lc1 and Lc2 as well as several control lines S(i).

The processing circuit 10 possesses an oscillator 11 for producing an exciting voltage Ue for the angle-position sensor elements, an analog/digital converter 12 for demodulation and for analog/digital conversion of the sensor signals Usin and Ucos, a drive circuit 13 for driving the switch elements of the multiplexer, a programmable arithmetic and control unit or, respectively, CPU 14 for the sequential processing of all signals from the angle-position sensor elements and a memory 15 for the intermediate storage of the output signals of the individual sensor elements 3, 5 and 7.

As shown in FIG. 1, the lines Le1 and Le2 supplying exciting AC are connected with the oscillator 11, whereas the output lines, which supply the output voltage Usin(i) and Ucos(i), are joined with the analog/digital converter 12.

Reference 16 denotes a driver circuit, which on the output side has signal lines 17, via which the absolute angular value is transferred to a supervising control and/or regulation unit.

As shown in FIG. 1 as well, the output signals of the sensor elements 3, 5 and 7 are applied via, for example, six lines, connected together in the multiplexer 8, to the processing circuit 10, which prepares the output signals of the angle-position sensor 1 after processing thereof in order to control or regulate, via a control or regulation circuit, the motor (not illustrated) driving the drive shaft 2.

From the multiplexer 8 in the illustrated embodiment of the invention the analog/digital converter 12 receives analog signals, which are converted into digital signal.

The arithmetic and control unit 14 receives the angle of rotation information (angle-position) of the individual sensor elements 3, 5 and 7, preferably as binary words, and causes intermediate storage thereof. The arithmetic and control unit 14 combines the output signals of the sensor elements 3, 5 and 7 in an inherently known fashion to give absolute angular information, which preferably takes into account a plurality of revolutions of the power shaft.

Figure 2:
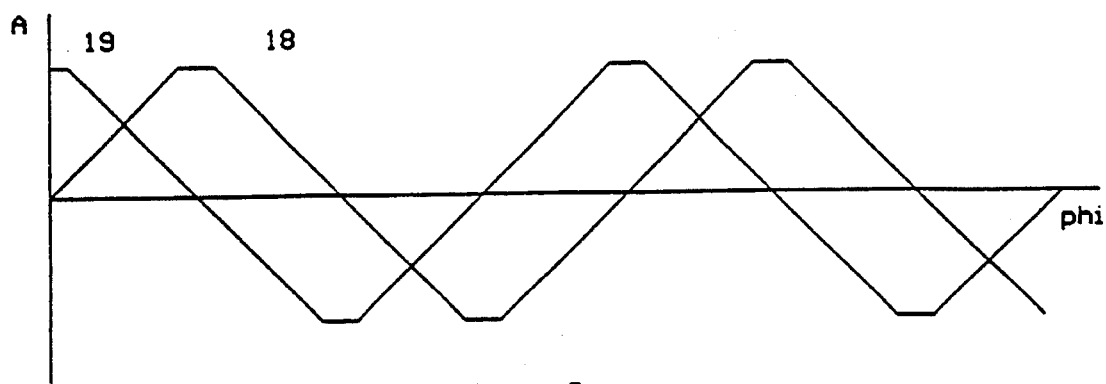
FIG. 2 shows the amplitude variations in the output voltage from the angle-position sensor.

FIG. 2 shows the variations in amplitude as a waveform A of the output voltages Usin 18 and Ucos and 19 of the sensor elements 3, 5 and 7 in a manner dependent on the angular position of the rotor or, respectively, of the power shaft 2 and corresponding generally to a sine or, respectively, cosine function.

Figure 3:
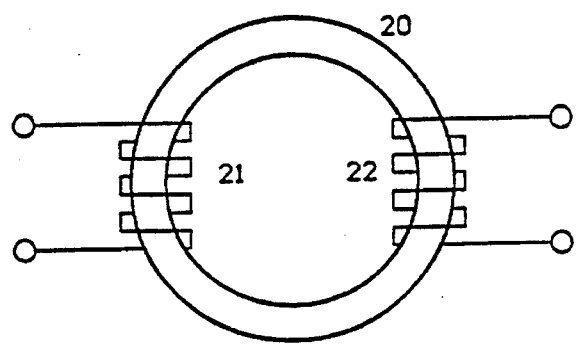
FIG. 3 shows a preferred embodiment of an inductive switch element.

FIG. 3 shows a preferred embodiment of a switch element for the multiplexer 8. A toroidal core choke 20 of a magnetic material with magnetically soft characteristic comprises a switching winding 21 and a switched winding 22, which are preferably wound in accordance with FIG. 3 opposite to each other on the toroidal core 20. One respective switching element S1 through S18 of the type described in connection with FIG. 3 is arranged in the multiplexer 8 of respective ones of the line linking points K1 through K6 illustrated in FIG. 3 so that in time multiplex operation the output signals on the lines Le1(i) and, respectively, Le2(i), . . . Lc2(i) from the sensors 3, 5 and 7 are supplied to the processing circuit 10. In other words this means that in accordance with the invention the multiplexer 8 in the illustrated working embodiment possesses six such switch elements for each sensor, something which is dependent on the number of input lines, which are connected with the sensor elements 3, 5 and 7.

Figure 4:
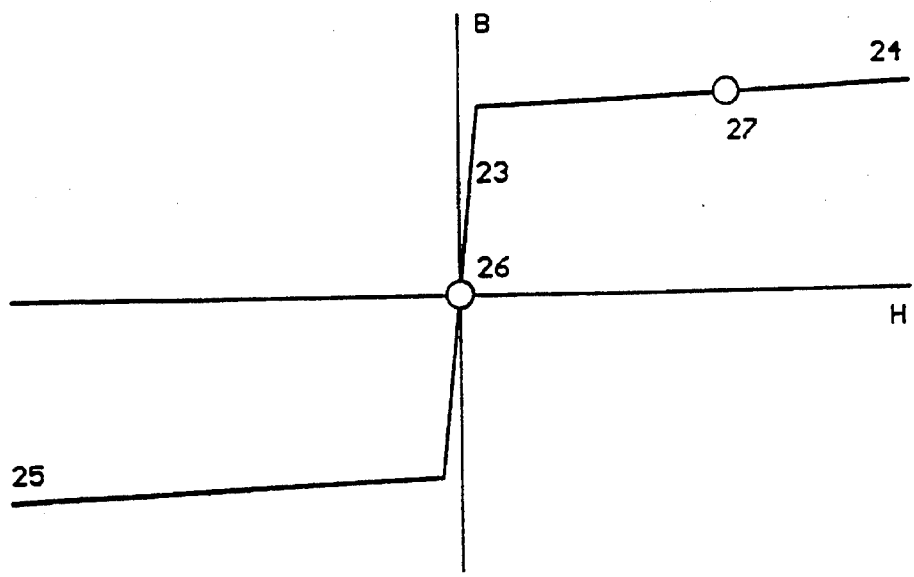
FIG. 4 shows the characteristic of the inductive switch element.

FIG. 4 shows the manner of operation of the switching element with reference to the magnetization characteristic of the toroidal core. The use of toroidal core chokes necessitates large differences in the differential permeability at the individual working points (operating points) with simultaneously low magnetic reversal losses. This is achieved by the use of magnetic materials with low retentivity or magnetically soft characteristic, respectively, having a Z-shaped magnetization characteristic. The magnetization characteristic, which indicates the magnetic flux density B as a function of the magnetic field force H, has as indicated in FIG. 4, an approximately linear, steep section 23 and two approximately linear, sections 24 and 25 with a small slope. The coercive field force of the material of the angle of rotation is low. Therefore the magnetic material of the toroidal core is practically free of hysteresis and produces only small magnetic reversal losses.

The switching effect of the switched winding 22 is obtained by modification of its inductive resistance. This is achieved by premagnetization of the toroidal core using the magnetic field, produced by a driving current, of the switching winding 21. When the switching winding is free of current, the "off" working point 26 of the switched winding 22 is at the coordinate origin of the magnetization characteristic with a high differential permeability. It follows from this that there is a high inductive resistance "off" switching state. If a sufficiently high level of DC flows through the switching winding 21, there will, owing to the premagnetization, be an "on" working point 27 of the switched winding on the gently sloping acting of the characteristic with a low differential permeability. From this it follows that there is a correspondingly smaller inductive resistance for the "on" condition of switching. The driven coil 22 is operated exclusively in the two predefined "on" and "off" working points. The voltage drop across the impedance of the switched winding 22 in the switched on state thereof falsifies the measured data signals. Owing to the ratiometric processing of the Usin(i) and Ucos(i) signals the latter is eliminated, like the error due to the resistance of the supply line.

Figure 5:
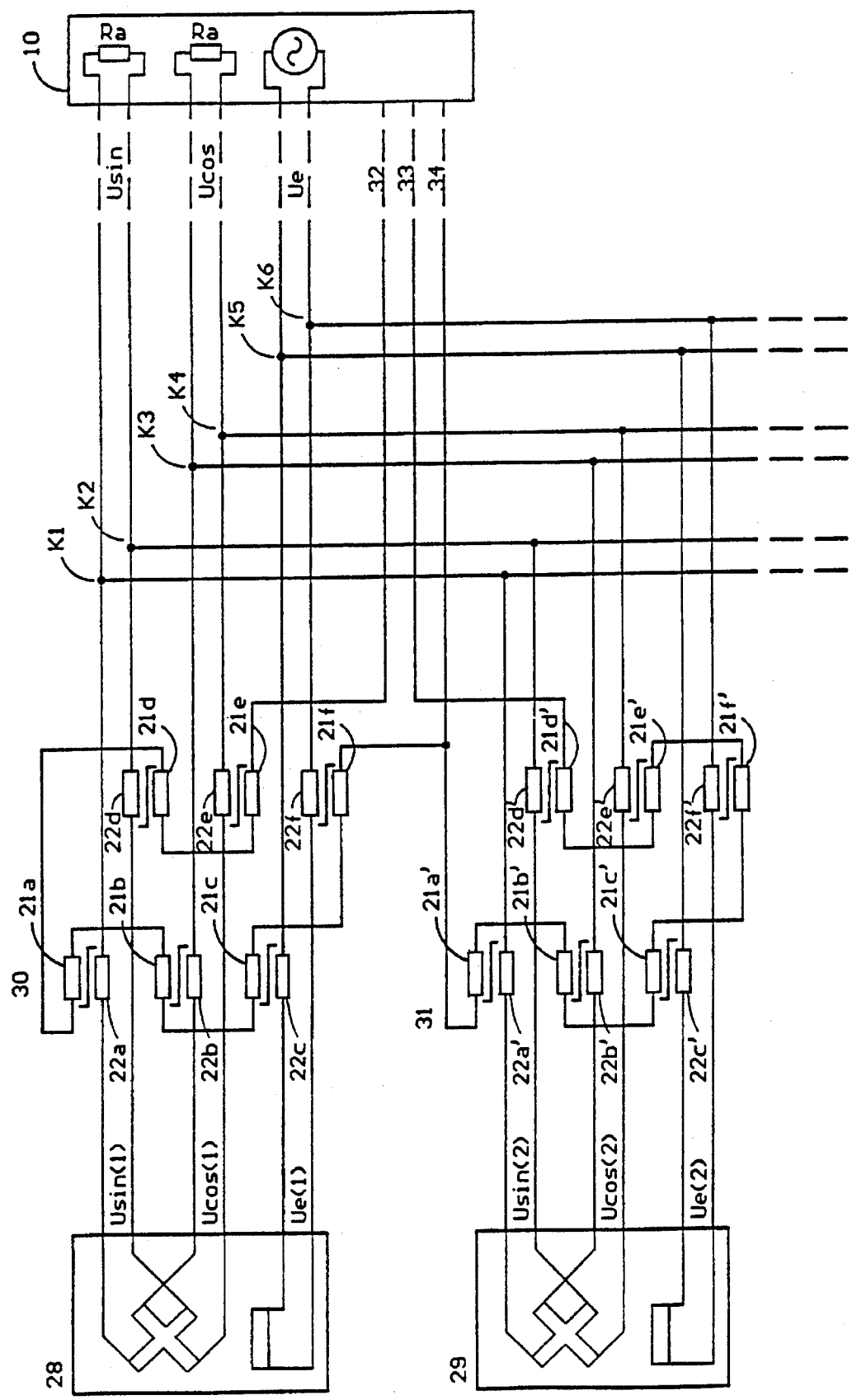
FIG. 5 shows a diagrammatic form of the multiplexer together with switch elements.

FIG. 5 shows one embodiment of the circuit design with two sensor elements 28 and 29 with the output voltages Usin(1), Ucos(u), Usin(2) and Ucos(2) and furthermore the exciting voltages Ue(1) and, respectively, Ue(2). Respectively one of the two groups is driven by current via control lines 32, 34 and 33, 34. The output voltages selected in this manner of the selected sensor element 28 or 29 are switched through via the connection lines to the processing electronic circuit 10 low ohmically, i.e. with low impedance.

It will be seen from the showing of FIG. 5 that by having suitable current signals on the control lines 32, 33 and 34 the respective switching windings 21a, 21b to 21f and, respectively, 21a' to 21f' are driven and in this fashion the signals of the respective switched winding 22a, 22b and the like are turned on for conduction. A turn-on-signal on the control lines 32 and 34 accordingly causes the driving of the switching windings 21a, 21b and the like of the upper group of switching elements and a turning on control signal on the control lines 33 and 34 causes the driving of the switching windings 21a', 21b' and the like of the lower group in FIG. 5, the upper group being associated with the sensor as in the present working example of the invention 28 and the lower group being associated with the sensor element 29.

The linking points of the individual lines are accordingly denoted in FIG. 1 and in FIG. 5 as K1 through K6 and they connect the output lines of the respective mutually associated switched windings 22 of the sensor elements. The ratio between the differential permeability of the toroidal core in the switched on condition and the differential permeability in the switched off state determines the switching ratio SV=Zoff/Zon of the switched coil for the "on" and "off" switching states (SV: switching ratio, Zoff: AC resistance in the "off" state, Zon: AC resistance in the "on" state). Since the AC resistance in the switched off state does not become unlimitedly large and in the switched on state does not become unlimitedly small, there is an addition together at the linking points of the voltages supplied by the switched on and switched off sensor elements in accordance with the switching ratio SV of the switching elements. Supposing that in the embodiment of the invention of FIG. 5 the element switching elements 22a through 22f are switched on and the switching elements 22a' through 22f are switched off, the voltage Usin will be built up across the linking points K1 - K2 proportionally in accordance with the switching ratio SV of the switch elements participating. In order to keep low the resulting error of measurement, SV must be made sufficiently large. This is done by the selection of a suitable magnet material and by suitable dimensioning of the windings of the switched toroidal core chokes (22a through 22f, 22a' through 22f').

The adaptation of the measurement signals Usin and Ucos to the processing electronic system 10 is implemented high ohmically (i.e. with high impedance) across the resistor Ra so that there is no error owing to an additional current load on the measuring circuit (see FIG. 5).

The coercive field force is a measure for the hysteresis of the magnet material. The hysteresis has an effect on the inductive resistance of the driven coil for the "off" switching state. Furthermore by magnetic reversal losses energy is derivated from the measuring branch and consequently the signal amplitude is reduced. The coercive field force of the magnetic material of the toroidal core accordingly must be made sufficiently small to ensure that errors in the measurement signal resulting from it are of the same order of size as the accuracy of measurement of the sensor elements.

The advantages of the invention are due to the substantial robustness as regards its electromagnetic, thermal and mechanical compatibility with the working environment and the low price of manufacture and the high accuracy of measurement.

In accordance with an advantageous embodiment of the invention the processing circuit 10 is arranged at a position remote from the point of measurement, that is to say it is not in the direct vicinity of the motor or of the sensor elements.

We claim:

1. An angle-position sensor for the absolute measurement of the angle of rotation over a plurality of revolutions, comprising:

a resolver connected with a rotary shaft to be monitored as a fine angle-position sensor element and providing analog AC output signals corresponding to fine angle-position;

a plurality of coarse angle-position sensor elements respectively coupled with the rotary shaft via a step down transmission, each coarse angle-position sensor element being an inductive sensor element and providing analog AC output signals corresponding to coarse angle-position;

an analog/digital converter for modulation and conversion of the analog AC output signals from the individual sensor elements into binary word data;

a time multiplexer for sequentially supplying the analog AC output signals from the individual sensor elements to the analog/digital converter; and an electronic processing circuit for storing the binary word data from the individual sensor elements and combining the same as absolute angular information over several revolutions, wherein the time multiplexer comprises a plurality of switching elements, each switching element including a torodial core choke and each torodial core choke including a switching winding and a switched winding.

2. A sensor as defined in claim 1, wherein the magnetic material of the toroidal core chokes has a magnetization characteristic with sections of approximately constant high differential permeability and approximately constant low differential permeability.

3. A sensor as defined in claim 1, wherein the magnet material of the toroidal core chokes possesses a low coercive field force.

4. A sensor as defined in claim 1, wherein the processing circuit is arranged at a position remote from the point of measurement.

5. An angle-position sensor for the absolute measurement of the angle of rotation over a plurality of revolutions, comprising:

a resolver connected with a rotary shaft to be monitored as a fine angle-position sensor element and providing analog AC output signals corresponding to fine angle-position;

a plurality of coarse angle-position sensor elements respectively coupled with the rotary shaft via a step down transmission, each coarse angle-position sensor element being an inductive sensor element and providing analog AC output signals corresponding to coarse angle-position;

an analog/digital converter for modulation and conversion of the analog AC output signals from the individual sensor elements into binary word data;

a time multiplexer for sequentially supplying an analog AC output signals from the individual sensor elements to the analog/digital converter; and an electronic processing circuit for storing the binary word data from the individual sensor elements and combining the same as absolute angular information over several revolutions, wherein the time multiplexer comprises a plurality of switching elements, each switching element including a torodial core choke and each torodial core choke including a switching winding and a switched winding, wherein said plurality of switching windings is connected to said electronic processing circuit via control lines thus being switched on/off by a driving current from said electronic processing circuit.

* * * * *